United States Patent
Ye et al.

(10) Patent No.: US 10,600,766 B2
(45) Date of Patent: Mar. 24, 2020

(54) DUAL-CHANNEL HEAT-CONDUCTING ENCAPSULATION STRUCTURE AND ENCAPSULATION METHOD OF A SOLID-STATE PHOSPHOR INTEGRATED LIGHT SOURCE

(71) Applicant: FUJIAN CAS-CERAMIC OPTOELECTRONICS TECHNOLOGY CO., LTD, Fuzhou, Fujian (CN)

(72) Inventors: Shanghui Ye, Fujian (CN); Jieqin Zhang, Fujian (CN); Maochun Hong, Fujian (CN); Wenxiong Lin, Fujian (CN); Wang Guo, Fujian (CN); Yunfeng Zhang, Fujian (CN)

(73) Assignee: FUJIAN CAS-CERAMIC OPTOELECTRONICS TECHNOLOGY CO., LTD., Fuzhou, Fujian (CN)

( * ) Notice: Subject to any disclaimer, the term of this patent is extended or adjusted under 35 U.S.C. 154(b) by 0 days.

(21) Appl. No.: 15/782,007

(22) PCT Filed: Jun. 8, 2016

(86) PCT No.: PCT/CN2016/085374
§ 371 (c)(1),
(2) Date: Jun. 6, 2018

(87) PCT Pub. No.: WO2017/107400
PCT Pub. Date: Jun. 29, 2017

(65) Prior Publication Data
US 2018/0358333 A1    Dec. 13, 2018

(30) Foreign Application Priority Data
Dec. 21, 2015    (CN) .......................... 2015 1 0965435

(51) Int. Cl.
*H01L 25/075*    (2006.01)
*H01L 33/50*    (2010.01)
(Continued)

(52) U.S. Cl.
CPC ........ *H01L 25/0753* (2013.01); *H01L 33/507* (2013.01); *H01L 33/642* (2013.01);
(Continued)

(58) Field of Classification Search
CPC . H01L 25/0753; H01L 33/507; H01L 33/642; H01L 33/56; H01L 33/644;
(Continued)

(56) References Cited

U.S. PATENT DOCUMENTS

| | | | |
|---|---|---|---|
| 8,917,010 B2 | 12/2014 | Yano et al. | |
| 2011/0180817 A1* | 7/2011 | Ishizaki | F21V 3/00 257/88 |

(Continued)

FOREIGN PATENT DOCUMENTS

| | | |
|---|---|---|
| CN | 202405312 U | 8/2012 |
| CN | 103972367 A | 8/2014 |

(Continued)

*Primary Examiner* — Tong-Ho Kim
(74) *Attorney, Agent, or Firm* — Novick, Kim & Lee, PLLC; Allen Xue (57) ABSTRACT

A dual-channel heat-conducting encapsulation structure of a solid-state phosphor integrated light source has a solid-state phosphor, a transparent organic silica gel, LED chips and a substrate. The LED chips are arranged on the substrate. The dual-channel heat-conducting encapsulation structure also has heat-conducting columns fixed on the substrate, and the heat-conducting columns are disposed away from the LED chips; the solid-state phosphor is placed on the heat-conducting columns without contacting the LED chips; the transparent organic silica gel is filled in the gap between the solid-state phosphor and the substrate. By adopting the (Continued)

design of double heat-conducting channels, separates two heat sources of the LED light source to sufficiently conduct the heat, the heat of the solid-state phosphor and the LED chips reaches the substrate through the respective channels, and then is transferred from the substrate through the heat sink into the atmosphere.

15 Claims, 5 Drawing Sheets (51) Int. Cl.
 *H01L 33/56* (2010.01)
 *H01L 33/64* (2010.01)
(52) U.S. Cl.
 CPC ............ *H01L 33/56* (2013.01); *H01L 33/644* (2013.01); *H01L 2933/005* (2013.01); *H01L 2933/0041* (2013.01); *H01L 2933/0075* (2013.01)

(58) Field of Classification Search
 CPC ....... H01L 2933/0041; H01L 2933/005; H01L 2933/0075
 USPC .......................................................... 257/88
 See application file for complete search history.

(56) References Cited

U.S. PATENT DOCUMENTS

2011/0227108 A1* 9/2011 Tetz ...................... H01L 33/507
 257/98
2015/0021635 A1* 1/2015 Qian ................... H01L 25/0753
 257/88

FOREIGN PATENT DOCUMENTS

CN          204303867 U       4/2015
CN          105470246 A       4/2016

* cited by examiner

Spectral parameters

Spectral distribution — Wavelength(nm) — CIE 1931 chromaticity diagram

CIE color parameters
Chromaticity coordinate: x = 0.3213 y =0.3453 / u' = 0.1977 v' = 0.4780
(duv=7.23e-03) Du,Dv'-0.0056,0.0045
Correlative color temperature: CCT = 5997K
Domain wavelength: λd=505.2nm   Colour purity =3.7%
peak wavelength λp=447nm  FWHM=23.3nm
Colour index: R=12.0% G=84.7% B=3.3%

Rendering index: Ra=68.7
R1=66  R2=72  R3=76  R4=70  R5=68  R6=63  R7=79  R8=57  R9=-41
R10=33  R11=67  R12=40  R13=66  R14=86  R15=60
Grade: OUT   White light classification: ANSI_5700K

Luminosity & Radinsity parameter
Flux Φ=71027lm  Light efficiency: 120.13lm/W
Radiation flux Φe=217.37 W
Electrical parameters
Voltage V = 137.5 V   Electric current I = 4.300 A   Power P = 591.3 W
Power factor PF = 1.000   Frequency = 50.00Hz
EVERFINE CORPORATION
http://www.everfine.cn

Figure 6

DUAL-CHANNEL HEAT-CONDUCTING ENCAPSULATION STRUCTURE AND ENCAPSULATION METHOD OF A SOLID-STATE PHOSPHOR INTEGRATED LIGHT SOURCE

TECHNICAL FIELD

The present invention relates to a solid-state phosphor integrated light source, in particular encapsulation structure and encapsulation method of a solid-state phosphor integrated light source.

BACKGROUND ART

LED light sources in the prior art generally are encapsulated by using a fluorescent organic colloid. Such encapsulation manner makes the fluorescent powder tightly appressed to the LED chips. In the case of low power, there is no great problem. However, the two large-power heat sources will be superimposed on each other after the power density is increased, especially when an integrated encapsulation manner is used. This will lead to a rapid increase in the junction temperature of the LED chips, cause attenuation, aging or even carbonization of the fluorescent powder and the organic colloid, and result in reduction in the luminous efficiency and service life of the light source.

The specific composition of a current solid-state phosphor integrated light source includes a solid-state phosphor, a transparent organic silica gel, LED chips, a dam-encircling colloid and a substrate. The LED chips are arranged on the substrate, a dam-encircling colloid disposed on the substrate is arranged at the periphery of the LED chips, the solid-state phosphor is placed on the LED chips and fixed by the dam, the transparent organic silica gel is filled in the gap between the solid-state phosphor and the substrate. In this way, the transparent organic silica gel can be used to isolate the solid-state phosphor from the LED chips, so as to prevent the heat source of the solid-state phosphor from being directly superimposed on the heat source of the LED chips. However, it has been found in practice that the transparent fluorescent gel, being a poor conductor of heat, results in an insufficient heat conduction, thereby failing to reduce the temperature effectively and increase the service life.

CONTENTS OF THE INVENTION

In order to solve the aforementioned technical problems, the present invention proposes dual-channel heat-conducting encapsulation structure and encapsulation method of a solid-state phosphor integrated light source. The present invention, by adopting the design of double heat-conducting channels, separates two heat sources of the LED light source to sufficiently conduct the heat, is able to effectively reduce the temperature of the solid-state phosphor and the LED chips, and increase the service life of the both.

The dual-channel heat-conducting encapsulation structure of a solid-state phosphor integrated light source proposed by the present invention comprises a solid-state phosphor, a transparent organic silica gel, LED chips and a substrate, wherein the LED chips are arranged on the substrate, and the dual-channel heat-conducting encapsulation structure further comprises heat-conducting columns fixed on the substrate, and the heat-conducting columns are disposed away from the LED chips; the solid-state phosphor is placed on the heat-conducting columns without contacting the LED chips; the transparent organic silica gel is filled in the gap between the solid-state phosphor and the substrate.

Further, the dual-channel heat-conducting encapsulation structure further comprises a dam-encircling colloid, which is disposed on said substrate and arranged in a circular form at the periphery of the LED chips; the solid-state phosphor is connected and fixed to the damn-encircling colloid.

Further, the host material of the solid-state phosphor is a material exhibiting a solid state at normal temperature, and the solid-state phosphor has the fluorescence effect of absorbing visible lights in the range of 400-500 nm or ultraviolet lights in the range of 250-400 nm, and exciting beams in the visible light band of 380-780 nm.

Further, the host material of the solid-state phosphor is a transparent ceramic, glass or PC.

Further, the heat-conducting columns have a transmittance of equal to or higher than 80%, or a reflectivity of higher than 80% for visible lights in the range of 380-780 nm or ultraviolet lights in the range of 250-400 nm.

Further, the heat conductivity of the heat-conducting columns is greater than 1.0 W/m·K.

Further, when the LED chips are mounted chips, the height of the heat-conducting columns is higher than the highest point of the bank of the LED chip welding wires; when the LED chips are flip chips, the height of the heat-conducting columns is higher than the height of the LED chips.

Further, when the LED chips are mounted chips, the heat-conducting columns are uniformly distributed in the clearances of the mounted chips, or are concentrated distributed in a small number.

Further, the flip-chip LED chips are distributed densely.

Further, the substrate is a metal substrate.

Further, the emission spectrum of the LED chips is visible light having a peak wavelength in the range of 400-500 nm or an ultraviolet light having a peak wavelength in the range of 250-400 nm.

Further, the substrate has a reflectivity of more than 80% for visible lights.

Further, the heat-conducting columns are transparent heat-conducting columns.

The present invention also proposes a dual-channel heat-conducting encapsulation method for a solid-state phosphor integrated light source, comprising the steps of:

step 10: the mirror layer of the substrate, in the central portion of which mirror aluminum is exposed, is formed into a die-bonding region, the peripheral portion of the substrate is pressed by a BT resin layer, on which positive and negative electrodes and circuits are provided;

step 20: LED chips are arranged uniformly in the die-bonding region of the substrate, and heat-conducting columns are arranged in the interspaces of the configuration of the LED chips;

step 30: baking is performed at the temperature of 150° C. for 2 hours, after the LED chips and the heat-conducting columns are adhesively bonded to the substrate, a wire welding operation is carried out;

step 40: a white organic silica gel is applied at the periphery of the die-bonding region to manufacture a circle of closed dam, and the gel is subjected to baking at the temperature of 150° C. for 30 min to accomplish the complete curing;

step 50: after the completion of the aforesaid operation, a proper amount of transparent organic silica gel is filled in the cup formed by the dam-encircling colloid, and then a fluorescent ceramic is pressed and fixed on it;

step 60: the fixed fluorescent ceramic light source is subjected to sufficient heat curing at the temperature of 60° C.

for 0.5 hour, or at the temperature of 80° C. for 0.5 hour, or at the temperature of 150° C. for 1 hour.

Further, in the step 40, the curing temperature is 150° C. and the curing duration is 30 min;

the step 50, to be specific, is to fill a proper amount of transparent organic silica gel by using spot-gluing process after the completion of wire welding, wherein the transparent organic silica gel is a transparent organic silica gel proportioned with AB components; to perform a heating at the temperature of 60° C. to accelerate the flow of the organic silica gel, and to press and fix a fluorescent ceramic on it after discharging of bubbles and leveling of the glue.

The advantageous effects of the present invention are as follows: the present invention, by using a transparent organic silica gel, isolates the solid-state phosphor from the LED chips, so as to prevent the heat source of the solid-state phosphor from being directly superimposed on the heat source of the LED chips, and by means of heat-conducting columns, accomplishes the conduction of the most heat of the solid-state phosphor, forms a heat-conducting channel from the solid-state phosphor, passing the heat-conducting columns, to the substrate. By means of the design of double heat-conducting channels, two heat sources of the LED light source are separated, in order to sufficiently conduct the heat, the heat of the solid-state phosphor and the LED chips reaches the substrate through the respective channels, and then is transferred from the substrate through the heat sink into the atmosphere, as a result, the temperature of the both can be effectively reduced, and the service life of the both can be increased.

DESCRIPTION OF THE DRAWINGS

The present invention will be further described with reference to the accompanying drawings in combination with the embodiments.

DETAILED DESCRIPTION OF THE INVENTION

Figure 1:
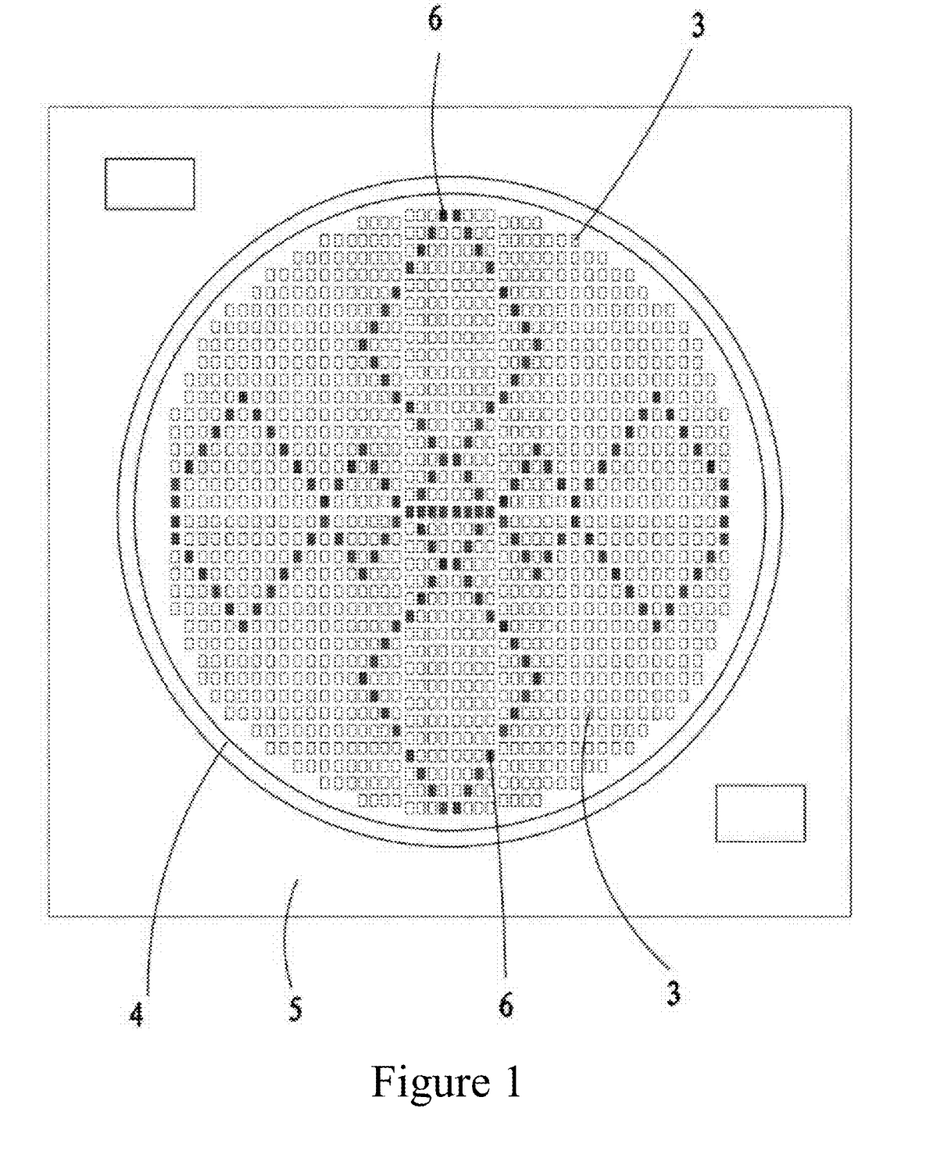
FIG. 1 is a schematic front view of the structure of a dual-channel heat-conducting encapsulation of a solid-state phosphor integrated light source according to the present invention.
Figure 2:
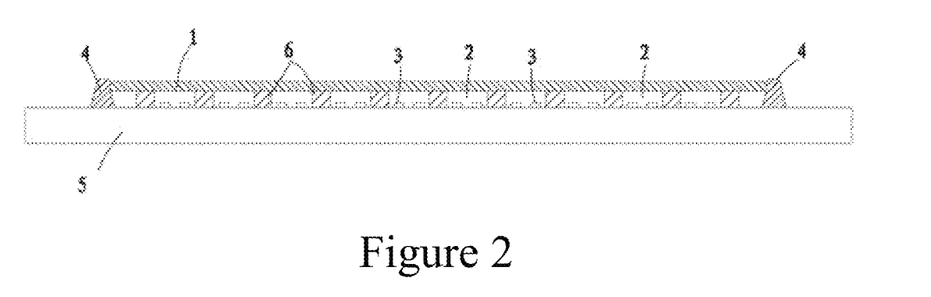
FIG. 2 is a schematic structural diagram of a longitudinal cross section in an embodiment of a dual-channel heat-conducting encapsulation of a solid-state phosphor integrated light source according to the present invention.
Figure 3:
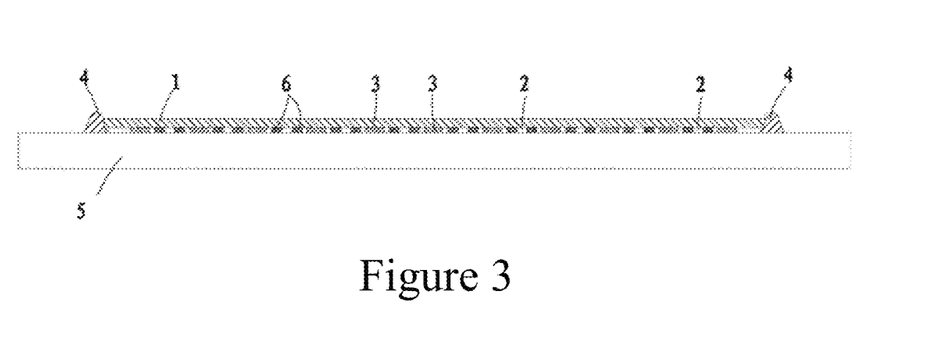
FIG. 3 is a schematic structural diagram of a longitudinal cross section in another embodiment of a dual-channel heat-conducting encapsulation of a solid-state phosphor integrated light source according to the present invention.

In order to make the objective, the technical solutions and the advantages of the present invention more intelligible, the present invention will be described in greater detail in combination with the specific embodiments with reference to the accompanying drawings. It is to be understood by those skilled in the art that the present invention is not limited to the drawings and the following embodiments. As shown in FIGS. 1 to 3, the dual-channel heat-conducting encapsulation structure of a solid-state phosphor integrated light source according to the present invention comprises a solid-state phosphor 1, a transparent organic silica gel 2, LED chips 3, a dam-encircling colloid 4 and a substrate 5, and it further comprises heat-conducting columns 6 fixed on the substrate 5, wherein the LED chips 3 and the dam-encircling colloid 4 are arranged on the substrate 5, and the dam-encircling colloid 4 is arranged in a circular form at the periphery of the LED chips 3, and the heat-conducting columns 6 are fixed on the substrate 5 and are disposed away from the LED chips 3; the solid-state phosphor 1 is placed on the heat-conducting columns 6, the periphery of the solid-state phosphor 1 is connected and fixed to the dam-encircling colloid 4, the transparent organic silica gel 2 is filled in the gap between the solid-state phosphor 1 and the substrate 5.

Wherein the host material of the solid-state phosphor 1 is a material exhibiting solid state at normal temperature, such as a transparent ceramic, glass or PC, etc., and the solid-state phosphor 1 has the fluorescence effect of absorbing visible lights in the range of 400-500 nm or ultraviolet lights in the range of 250-400 nm, and exciting beams in the visible light band of 380-780 nm.

The heat-conducting columns 6 have a transmittance of equal to or higher than 80%, or a reflectivity of higher than 80% for visible lights in the range of 380-780 nm or ultraviolet lights in the range of 250-400 nm. The heat conductivity of the heat-conducting columns is greater than 1.0 W/m·K. The heat-conducting columns are transparent heat-conducting columns, preferably aluminum oxide transparent ceramic columns.

When the LED chips 3 are mounted chips, the height of the heat-conducting columns 6 is higher than or equal to the highest point of the bank of the LED chip 3 welding wires; when the LED chips 3 are flip chips, the height of the heat-conducting columns 6 is higher than or equal to the height of the LED chips 3.

The distribution of the heat-conducting columns 6 may be in various forms, preferably, the heat-conducting columns 6 are uniformly distributed in the clearances of the mounted LED chips 3, or are concentrated distributed in a small number, and it is also possible that the flip-chip LED chips 3 are distributed densely.

The emission spectrum of the LED chips 3 is visible light having a peak wavelength in the range of 400-500 nm or an ultraviolet light having a peak wavelength in the range of 250-400 nm.

The substrate 5 is provided with circuits at the side where chips are placed, and it has a reflectivity of more than 80% for visible lights. The substrate is a metal substrate, preferably a mirror aluminum COB substrate.

The solution for implementing the dual-channel heat-conducting encapsulation method for a solid-state phosphor integrated light source according to the present invention is: dual-channel heat-conducting encapsulation method for a solid-state phosphor integrated light source, comprising the steps of:

step 10: the mirror layer of the substrate, in the central portion of which mirror aluminum is exposed, is formed into a die-bonding region, the peripheral portion of the substrate is pressed by a BT (bismaleimide triazine) resin layer, on which positive and negative electrodes and circuits are provided;

step 20: LED chips are arranged uniformly in the die-bonding region of the substrate, and heat-conducting columns are arranged in the interspaces of the configuration of the LED chips;

step 30: baking is performed at the temperature of 150° C. for 2 hours, after the LED chips and the heat-conducting columns are adhesively bonded to the substrate, a wire welding operation is carried out;

step 40: a white organic silica gel is applied at the periphery of the die-bonding region to manufacture a circle of closed dam, and the gel is subjected to baking at the temperature of 150° C. for 30 min to accomplish the complete curing;

step 50: after the completion of the aforesaid operation, a proper amount of transparent organic silica gel is filled in the cup formed by the dam-encircling colloid, and then a fluorescent ceramic is pressed and fixed on it; to be specific, a proper amount of transparent organic silica gel is filled by using spot-gluing process after the completion of wire welding, wherein the transparent organic silica gel is a transparent organic silica gel proportioned with AB components; a heating is performed at the temperature of 60° C. to accelerate the flow of the organic silica gel, and a fluorescent ceramic is pressed and fixed on it after discharging of bubbles and leveling of the glue;

step 60: the fixed fluorescent ceramic light source is subjected to sufficient heat curing at the temperature of 60° C. for 0.5 hour, or at the temperature of 80° C. for 0.5 hour, or at the temperature of 150° C. for 1 hour.

In the present embodiment, a mirror aluminum COB substrate is used, and the fluorescent ceramic is preferably YAG fluorescent ceramic; the LED chips are 22*35 mounted chips of the brand SAN AN, having a chip height of 120 μm; the heat-conducting columns 6 are aluminum oxide transparent ceramic columns with the dimensions 35 μm×35 μm×220 μm. Taking a 500 W solid-state phosphor integrated light source as an example, it is possible to arrange 1156 LED chips 3 and 120 transparent ceramic heat-conducting columns 6. However, the present invention is not limited to the aforesaid embodiment.

The present invention, by using a transparent organic silica gel, isolates the solid-state phosphor from the LED chips, so as to prevent the heat source of the solid-state phosphor from being directly superimposed on the heat source of the LED chips, and by means of heat-conducting columns, accomplishes the conduction of the most heat of the solid-state phosphor, forms a heat-conducting channel from the solid-state phosphor, passing the heat-conducting columns, to the substrate. By means of the design of double heat-conducting channels, two heat sources of the LED light source are separated, in order to sufficiently conduct the heat, the heat of the solid-state phosphor and the LED chips reaches the substrate through the respective channels, and then is transferred from the substrate through the heat sink into the atmosphere, as a result, the temperature of the both can be effectively reduced, and the service life of the both can be increased.

In order to specify the technical effects that can be reached by the present invention, we made a comparison of effects as follows:

Sample 1: No heat-conducting column is provided, and the other conditions stay unchanged.
Sample 2: Fluorescent powder gel is used, and the other conditions stay unchanged.
Sample 3: Heat-conducting columns are provided, and the other conditions stay unchanged.
Test power: 600 W.

Sample 1 is scorched at the temperature of 200° C., so the data are not included.

Figure 4:
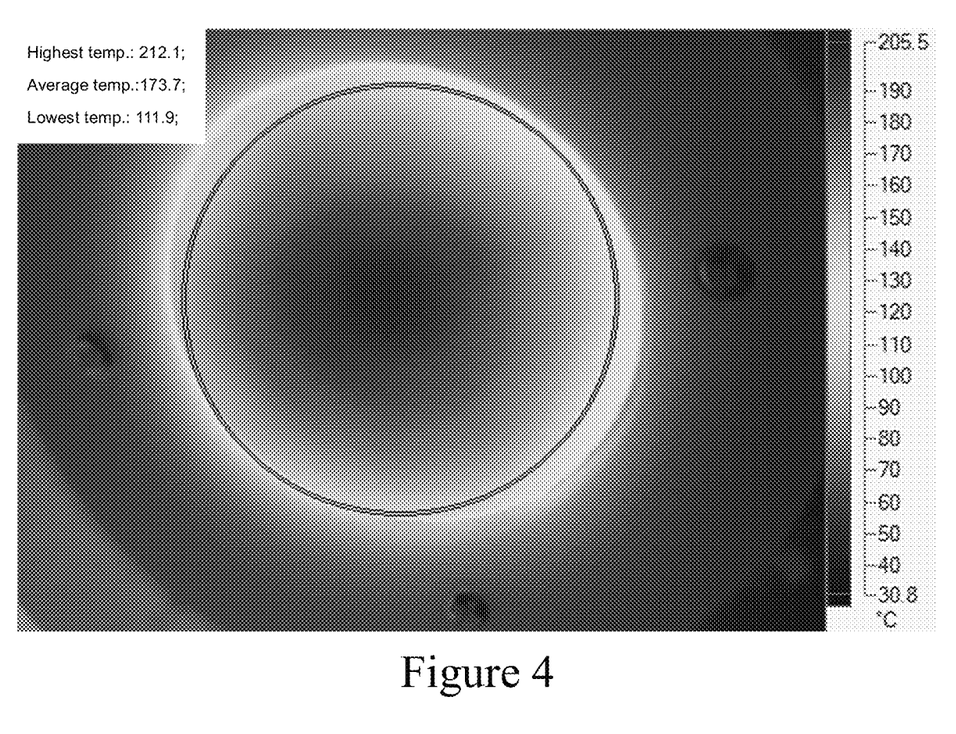
FIG. 4 is a diagram showing the temperature distribution of sample 2 of the present invention.

The temperature distribution diagram of sample 2 is as shown in FIG. 4, and the highest and lowest temperatures are as shown in Table 1:

TABLE 1

| The highest temperature | The average temperature | The lowest temperature |
| --- | --- | --- |
| 212.1° C. | 173.7° C. | 111.9° C. |

Figure 5:
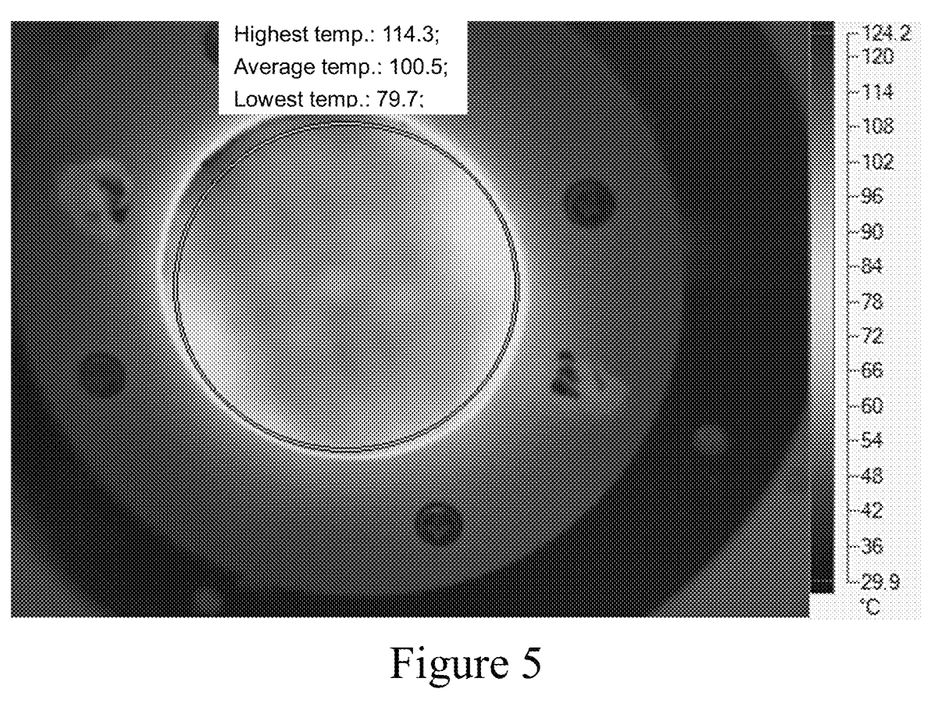
FIG. 5 is a diagram showing the temperature distribution of sample 3 of the present invention.

The temperature distribution diagram of sample 3 is as shown in FIG. 5, and the highest and lowest temperatures are as shown in Table 2:

TABLE 2

| The highest temperature | The average temperature | The lowest temperature |
| --- | --- | --- |
| 114.3° C. | 100. 5° C. | 79.7° C. |

From the test values, the temperature uniformity of the sample 3 was significantly improved compared to sample 2, especially, the ceramic center temperature was reduced by about 53.89%, and the average temperature was reduced by about 42.14%. In the case of sample 1, it was scorched and became useless in the early stages of the experiment.

Figure 6:
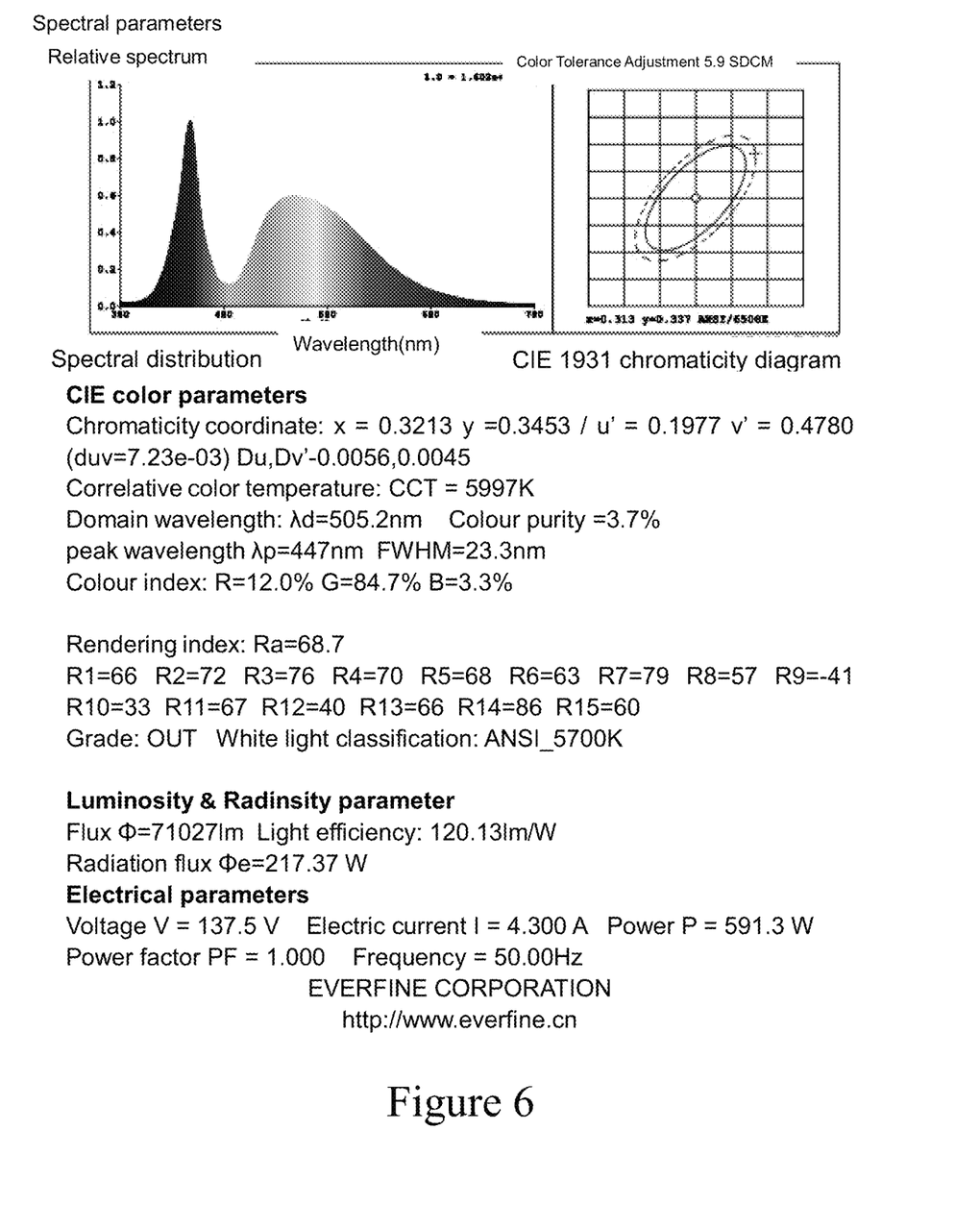
FIG. 6 is a spectrogram of the present invention.

At the same time, the solution has no negative influence on the luminous efficiency, and can even increase the luminous efficiency to a certain extent. As shown in FIG. 6, the luminous efficiency reached 120 lm/W at 600 W.

Although the specific embodiments of the present invention have been described above, yet it shall be understood by a skilled person who has a knowledge of this technical field that the specific embodiments we describe are just illustrative and are not intended to limit the scope of the present invention, any equivalent modifications and changes made by a skilled person who has a knowledge of this technical field in accordance with the spirit of the present invention shall be included in the protection scope of the claims of the present invention.

The invention claimed is:

1. A solid-state phosphor integrated light source, comprising a solid-state phosphor, a transparent organic silica gel, a plurality of LED chips, a plurality of heat-conducting columns, and a substrate,
    wherein each of the plurality of heat-conducting columns has a first end in contact with the solid-state phosphor and a second end in contact with the substrate so as to form a pap between the solid-state phosphor and the substrate, wherein the plurality of LED chips are disposed on the substrate inside the gap, the transparent organic silica gel fills a space in the gap, and
    wherein each of the plurality of heat-conducting columns is located in an interspace between two or more of the plurality of LED chips.

2. The solid-state phosphor integrated light source according to claim 1, further comprising a circle of colloid material encircling the plurality of LED chips and the plurality of heat-conducting column, and wherein the solid-state phosphor is affixed to the circle of colloid material.

3. The solid-state phosphor integrated light source according to claim 1, wherein the solid-state phosphor has a fluorescence effect of absorbing visible light in a range of 400-500 nm or ultraviolet light in a range of 250-400 nm, and excites light in a range of 380-780 nm.

4. The solid-state phosphor integrated light source according to claim 3, wherein a host material of the solid-state phosphor is a transparent ceramic or glass.

5. The solid-state phosphor integrated light source according to claim 1, wherein the plurality of heat-conducting columns have a transmittance equal to or higher than 80%, or a reflectivity of higher than 80% for visible light in a range of 380-780 nm or for ultraviolet light in a range of 250-400 nm.

6. The solid state phosphor integrated light source according to claim 5, wherein a heat conductivity of the heat-conducting columns is greater than 1.0 W/mK.

7. The solid-state phosphor integrated light source according to claim 1, wherein:
when the plurality of LED chips are mounted chips having welding wires connected thereto, the first ends of the plurality of heat-conducting columns are positioned higher than a highest point the welding wires; and
when the LED chips are flip chips, the first ends of the plurality of heat-conducting columns is higher than a highest point of the LED chips.

8. The solid state phosphor integrated light source according to claim 7, wherein the plurality of LED chips are mounted chips, and the plurality of heat-conducting columns are uniformly distributed in spaces amongst the plurality of mounted chips.

9. The solid state phosphor integrated light source according to claim 7, wherein the plurality of LED chips are flip-chip LED chips and are distributed densely on the substrate.

10. The solid-state phosphor integrated light source according to claim 1, wherein the substrate is a metal substrate.

11. The solid-state phosphor integrated light source according to claim 1, wherein an emission spectrum of each of the plurality of LED chips is visible light having a peak wavelength in a range of 400-500 nm or ultraviolet light having a peak wavelength in a range of 250-400 nm.

12. The solid-state phosphor integrated light source according to claim 1, wherein the substrate has a reflectivity of more than 80% for visible light.

13. The solid-state phosphor integrated light source according to claim 1, wherein the plurality of heat-conducting columns are transparent aluminum oxide ceramic columns.

14. An encapsulation method for the solid-state phosphor integrated light source of claim 1, comprising:
step 10: preparing the substrate to have a central portion for die-bonding the plurality of LED chips and a peripheral portion covered by a BT resin layer and have positive and negative electrodes and circuits disposed thereon;
step 20: attaching the plurality of LED chips uniformly in the central portion of the substrate, and disposing the plurality of heat-conducting columns in a plurality of interspaces among the plurality of LED chips;
step 30: heating the substrate at a temperature of 150° C. for 2 hours;
step 40: applying a first organic silica gel to form a circle surrounding the central portion of the substrate and curing the first organic silica gel circle at 150° C. for 30 min;
step 50: filling the first organic silica gel circle with a transparent organic silica gel and then pressing the solid-state phosphor against the transparent organic silica gel;
step 60: curing the object obtained from step 50 at 60° C. for 0.5 hour, or at 80° C. for 0.5 hour, or at 150° C. for 1 hour.

15. The encapsulation method according to claim 14, wherein
in the step 50, the transparent organic silica gel is applied by using spot-gluing process after wire welding of the plurality of LED chips.

* * * * *